US009865805B2

(12) United States Patent
Seino et al.

(10) Patent No.: US 9,865,805 B2
(45) Date of Patent: Jan. 9, 2018

(54) METHOD FOR MANUFACTURING MAGNETORESISTIVE ELEMENT

(71) Applicant: CANON ANELVA CORPORATION, Kawasaki-shi, Kanagawa (JP)

(72) Inventors: Takuya Seino, Kawasaki (JP); Kazumasa Nishimura, Kawasaki (JP); Hiroki Okuyama, Kawasaki (JP); Yuichi Otani, Kawasaki (JP); Yuta Murooka, Kawasaki (JP); Yoshimitsu Shimane, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 0 days.

(21) Appl. No.: 14/742,169

(22) Filed: Jun. 17, 2015

(65) Prior Publication Data

US 2016/0005958 A1    Jan. 7, 2016

Related U.S. Application Data

(63) Continuation of application No. PCT/JP2013/005249, filed on Sep. 4, 2013.

(30) Foreign Application Priority Data

Dec. 20, 2012   (JP) .................. 2012-278264

(51) Int. Cl.
*H01L 21/00* (2006.01)
*H01L 43/12* (2006.01)
(Continued)

(52) U.S. Cl.
CPC .............. *H01L 43/12* (2013.01); *H01L 43/08* (2013.01); *H01L 43/10* (2013.01);
(Continued)

(58) Field of Classification Search
CPC ......... H01L 43/12; H01L 43/10; H01L 43/08; H01L 21/02271; H01L 37/00;
(Continued)

(56) References Cited

U.S. PATENT DOCUMENTS 6,291,365 B1 * 9/2001 Koba ................ H01L 21/28167
257/E21.193
6,774,012 B1 * 8/2004 Narayanan ........ H01L 21/28247
118/52

(Continued)

FOREIGN PATENT DOCUMENTS

JP    2003-304012 A    10/2003
JP    2008-103661 A    5/2008
(Continued)

OTHER PUBLICATIONS

Choi, Y., et al., "Novel Stack Structure of Magnetic Tunnel Junction with MgO Tunnel Barrier Prepared by Oxidation Methods: Preferred Grain Growth Promotion Seed Layers and Bi-layered Pinned Layer," Japanese Journal of Applied Physics, vol. 48, pp. 120124-1-120124-3 (2009).

(Continued)

*Primary Examiner* — Vu A Vu
(74) *Attorney, Agent, or Firm* — Fitzpatrick, Cella, Harper & Scinto

(57) ABSTRACT

Provided is a method for manufacturing a magnetoresistive element, including a step of forming a tunnel barrier layer, wherein the step of forming the tunnel barrier layer includes a deposition step of depositing a metal film on top of a substrate, and an oxidation step of subjecting the metal film to an oxidation process. The oxidation step includes holding the substrate having Mg formed thereon, on a substrate holder in a processing container in which the oxidation process is performed, supplying an oxygen gas to the substrate by introducing the oxygen gas into the processing (Continued)

container, at a temperature at which Mg does not sublime, and heating the substrate after the introduction of the oxygen gas.

21 Claims, 10 Drawing Sheets

(51) Int. Cl.
*H01L 43/08* (2006.01)
*H01L 43/10* (2006.01)
H01L 21/02 (2006.01)
H01L 37/00 (2006.01)
H01L 41/20 (2006.01)
H01L 21/28 (2006.01)

(52) U.S. Cl.
CPC .... *H01L 21/0226* (2013.01); *H01L 21/02104* (2013.01); *H01L 21/02205* (2013.01); *H01L 21/02263* (2013.01); *H01L 21/02271* (2013.01); *H01L 21/02436* (2013.01); *H01L 21/28061* (2013.01); *H01L 37/00* (2013.01); *H01L 41/20* (2013.01)

(58) Field of Classification Search
CPC ........... H01L 21/0226; H01L 21/02205; H01L 21/02436; H01L 41/20; H01L 21/02263; H01L 21/2806; H01L 21/02104
USPC ............................................................ 438/3
See application file for complete search history.

(56) References Cited

U.S. PATENT DOCUMENTS

| | | | |
|---|---|---|---|
| 6,943,041 B2 | 9/2005 | Sugita et al. | |
| 7,969,693 B2 | 6/2011 | Ikarashi et al. | |
| 8,288,234 B2 | 10/2012 | Seino et al. | |
| 8,481,382 B2 | 7/2013 | Kitano et al. | |
| 8,728,830 B2 | 5/2014 | Nishimura | |
| 8,835,296 B2 | 9/2014 | Wakayanagi et al. | |
| 8,993,351 B2 | 3/2015 | Yamamoto et al. | |
| 2004/0235202 A1 | 11/2004 | Sugita et al. | |
| 2008/0072821 A1* | 3/2008 | Dalton | C30B 25/14 118/715 |
| 2008/0165330 A1* | 7/2008 | Mizutani | H01L 21/6875 355/30 |
| 2008/0174921 A1 | 7/2008 | Ikarashi et al. | |
| 2009/0321246 A1 | 12/2009 | Tsunekawa et al. | |
| 2010/0133092 A1* | 6/2010 | Mashimo | C23C 14/165 204/192.21 |
| 2010/0307686 A1* | 12/2010 | Iizuka | H01L 21/67115 156/345.34 |
| 2013/0134032 A1 | 5/2013 | Tsunekawa et al. | |
| 2014/0353149 A1 | 12/2014 | Seino et al. | |

FOREIGN PATENT DOCUMENTS

| | | |
|---|---|---|
| JP | 2008-103662 A | 5/2008 |
| JP | 2013-145846 A | 7/2013 |
| WO | 03/092084 A1 | 11/2003 |
| WO | 2010/044134 A1 | 4/2010 |
| WO | 2012/086183 A1 | 6/2012 |

OTHER PUBLICATIONS

Worledge, D.C., et al., "Spin Torque Switching of Perpendicular Ta/CoFeB/MgO-based Magnetic Tunnel Junctions," Applied Physics Letters, vol. 98, pp. 022501-1-022501-3 (2011).

Kubota, H., et al., "Enhancement of Perpendicular Magnetic Anisotropy in FeB Free Layers Using a Thin MgO Cap Layer," Journal of Applied Physics, vol. 111, pp. 07C723-1-07C723-3 (2012).

International Search Report issued in PCT/JP2013/005249, dated Oct. 8, 2013 (3 pages).

\* cited by examiner

METHOD FOR MANUFACTURING MAGNETORESISTIVE ELEMENT

CROSS-REFERENCES TO RELATED APPLICATIONS

This application is a continuation application of International Application No. PCT/JP2013/005249, filed Sep. 4, 2013, which claims the benefit of Japanese Patent Application No. 2012-278264 filed Dec. 20, 2012. The contents of the aforementioned applications are incorporated herein by reference in their entireties.

TECHNICAL FIELD

The present invention relates to a method for manufacturing a magnetoresistive element.

BACKGROUND ART

Heretofore, a magnetoresistive change element has been used mainly as an element for reading in a magnetic field from media of a hard disk drive. The magnetoresistive element utilizes a magnetoresistive effect of changing electrical resistance by application of a magnetic field to the element, and hard disk drive industry uses a TMR head using a tunnel magnetoresistive (TMR) effect of exhibiting a greater rate of resistance change than that of a GMR head using a giant magnetoresistive (GMR) effect, which in turn achieves a dramatic improvement in record density. Meanwhile, MRAM (magnetic random access memory) which is an integrated magnetic memory achieved by integrating this TMR technology with a semiconductor element has already started its commercialization. The MRAM includes a TMR element made of a magnetic material, formed on top of a semiconductor device, as distinct from SRAM (static RAM) or DRAM (dynamic RAM) which has hitherto been formed of a semiconductor element alone. Moreover, the MRAM enables a dramatic improvement in power consumption because of its non-volatility, and is thus expected to achieve larger capacity, in mobile communication market.

The MRAM uses, as the TMR element, an element of an in-plane magnetization type in which a direction of magnetization of a free layer and a reference layer spins in a direction perpendicular to a direction of a multilayer film, as disclosed in Non Patent Document 1. The MRAM poses the problem of being incapable of large storage capacity because of its large memory cell for storing data. By recent research and development, however, STT (Spin Transfer Torque)-MRAM using spin injection can be expected to overcome a drawback inherent in the MRAM and hence achieve larger capacity. This technology can change a direction of magnetization of the magnetic material by utilizing magnetic moment produced by spin of electrons, thus enabling miniaturization and also a reduction in a current value required for writing of data. Therefore, the STT-MRAM can operate even with a small-sized element and is thus suitable for higher density. The STT-MRAM uses the element of the in-plane magnetization type as is the case with the MRAM, and an element of a perpendicular magnetization type in which the direction of magnetization of the free layer and the reference layer spins in the same direction as the direction of the multilayer film. A typical multilayer film structure of the perpendicular magnetization type is disclosed in Non Patent Document 2. Further, research and development of materials and structures is stepped up so that magnetization can reverse even with the small-sized element, and there has also been a report on a structure in which an oxide layer is formed on top of the free layer, as disclosed in Non Patent Document 3.

Manufacture of the TMR element not only uses the structures disclosed in Non Patent Documents 1 and 2, but also widely uses a sputtering deposition (hereinafter, also called merely sputtering) method which involves sputtering a target made of a desired deposition material thereby to deposit a film on a facing substrate. (Refer to Patent Document 1.) Further, there is a need for a crystallization annealing device for improving the rate of resistance change of the element, a substrate cooling device subsequent to annealing, and an oxidation device for forming the oxide layer, as well as a sputtering device. In the future, making full use of these devices for development of high-performance element structures as well as materials is essential in order to achieve practical use of SIT-RAM.

CITATION LIST

Patent Document

Patent Document 1: International Patent Publication No. WO/2012/086183

Non Patent Document

Non Patent Document 1: Young-suk Choi et al., Journal of Appl. Phys. 48 (2009) 120214
Non Patent Document 2: D. C. Worledge et al., Appl. Phys. Lett. 98 (2011) 022501
Non Patent Document 3: Kubota et al., Journal of Appl. Phys. 111, 07C723 (2012)

SUMMARY OF INVENTION

For fabrication of the above-described MRAM, an improvement in throughput is sought in order to achieve cost reduction. Also, for example, when a metal film as a structural element of the MRAM is oxidized to form a barrier layer, the absence of quick oxidation of the metal film leads to mixing of impurities and in turn to deterioration in reliability or characteristics of the element. The improvement in the throughput is sought also for purposes of reduction in the mixing of the impurities.

Also, heretofore, a method which involves heating a substrate having the metal film formed thereon to a predetermined temperature thereby to oxidize the metal film has sometimes been adopted as a process for oxidation of the metal film for formation of the barrier layer. In this case, the substrate having the metal film formed thereon is heated to a target temperature in an oxidation process chamber, and thereafter, oxygen is introduced into the oxidation process chamber to perform the oxidation process.

However, in a case where a material for the metal film for use in the formation of the barrier layer is magnesium (Mg), when Mg is heated to the target temperature, Mg sublimes with increasing temperature, because Mg in particular is a sublimation-prone material. Thus, at the time of start of oxygen introduction, a film thickness of Mg is reduced by the amount of sublimation of Mg. After completion of the oxidation process, therefore, a film thickness of magnesium oxide (MgO) generated by the oxidation process is less than a designed value. Meanwhile, Mg may conceivably be formed in advance in a greater thickness than the designed value, allowing for the sublimation during deposition of Mg;

however, this involves excessive deposition of Mg with respect to the designed value, thus leading to an increase in cost.

The present invention has been made in view of the foregoing problems. An object of the present invention is to provide a method for manufacturing a magnetoresistive element, capable of reducing sublimation of metal during oxidation of the metal, while improving throughput in formation of a tunnel barrier layer of a metal oxide.

In order to attain the above object, according to a first aspect of the present invention, there is provided a method for manufacturing a magnetoresistive element, including: a step of forming one of a magnetization free layer and a magnetization pinned layer; a step of forming a tunnel barrier layer on top of the formed one of the magnetization free layer and the magnetization pinned layer; and a step of forming the other of the magnetization free layer and the magnetization pinned layer on top of the tunnel barrier layer, wherein the step of forming the tunnel barrier layer includes a deposition step of depositing a metal film on top of a substrate, and an oxidation step of subjecting the metal film to an oxidation process, wherein the oxidation step includes a step of holding the substrate having the metal film formed thereon, on a supporting portion protruding from a substrate holding surface of a substrate holder in a processing container in which the oxidation process is performed, a step of supplying an oxygen gas to the substrate by introducing the oxygen gas into the processing container, in a state where the substrate is mounted on the supporting portion, a substrate mounting step of mounting the substrate on the substrate holding surface, after start of introduction of the oxygen gas, and a heating step of heating the substrate mounted on the substrate holding surface.

According to a second aspect of the present invention, there is provided a method for manufacturing a magnetoresistive element, including: a step of forming one of a magnetization free layer and a magnetization pinned layer; a step of forming a tunnel barrier layer on top of the formed one of the magnetization free layer and the magnetization pinned layer; and a step of forming the other of the magnetization free layer and the magnetization pinned layer on top of the tunnel barrier layer, wherein the step of forming the tunnel barrier layer includes a deposition step of depositing a metal film on top of a substrate, and an oxidation step of subjecting the metal film to an oxidation process, wherein the oxidation step includes a step of holding the substrate having the metal film formed thereon, on a substrate holder in a processing container in which the oxidation process is performed, a step of supplying an oxygen gas to the substrate by introducing the oxygen gas into the processing container, at a temperature at which the metal film does not sublime, and a heating step of heating the substrate simultaneously with or after the introduction of the oxygen gas, wherein the oxidation step further includes a step of, after the step of holding, forming in the processing container a space formed by a substrate holding surface of the substrate holder and a surrounding portion provided in the processing container, by changing a relative position of the substrate holder with respect to the processing container, wherein the space is formed such that the substrate holding surface is surrounded by the surrounding portion and a gap is formed between the surrounding portion and the substrate holder, wherein the oxygen gas introduced into the space is evacuated from the space through the gap.

According to the present invention, it is possible to reduce sublimation of metal during oxidation of the metal, while improving throughput in formation of a tunnel barrier layer of a metal oxide.

DESCRIPTION OF EMBODIMENTS

Figure 1:
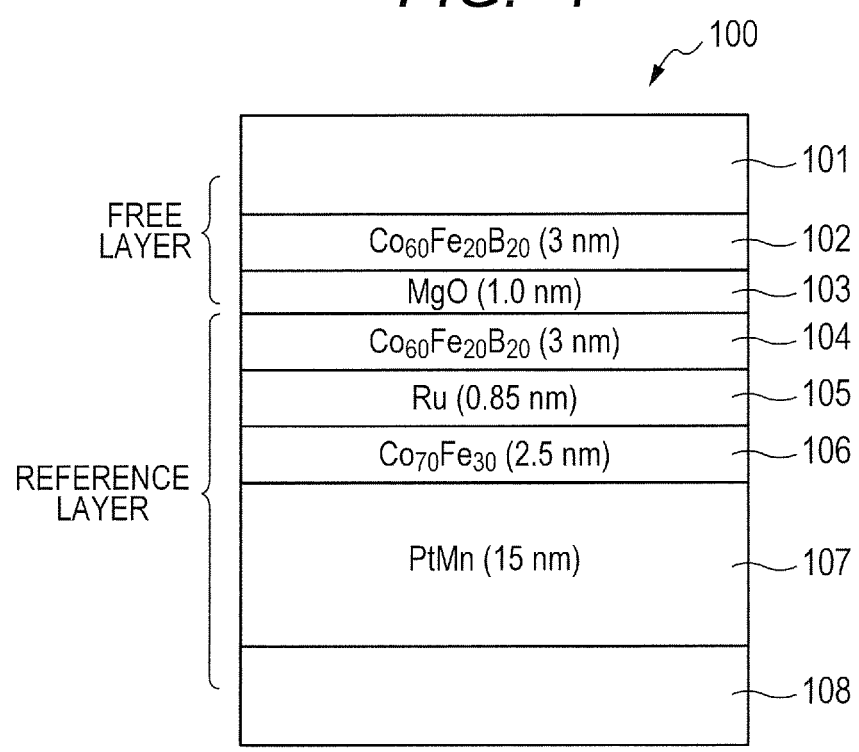
FIG. 1 is a schematic diagram of a multilayer structure of an in-plane magnetization type element as one example of an element which is applied to an oxidation process according to one embodiment of the present invention.

Although embodiments of the present invention will be described below with reference to the drawings, it is to be understood that the present invention is not limited to the embodiments. In the drawings described below, parts having the same functions are indicated by the same reference numerals, and repeated description of the parts may be omitted.

FIG. 1 is a schematic diagram of a multilayer structure of an in-plane magnetization type element (hereinafter called an MTJ (Magnetic Tunnel Junction) element) disclosed in Non Patent Document 1. In an MTJ element 100, a compound containing tantalum (Ta) and copper (Cu), for example, is first stacked as a lower electrode layer 108 on top of a process substrate. The lower electrode layer 108 has a structure such for example as Ta (5 nm)/CuN (20 nm)/Ta (5 nm). Upper Ta also serves as an underlayer film, and, besides Ta, metal such as hafnium (Hf), niobium (Nb), zirconium (Zr), titanium (Ti), molybdenum (Mo), or tungsten (W) may be used. Further, a layer containing at least one element of nickel (Ni), iron (Fe), chromium (Cr), and ruthenium (Ru), for example, may be deposited on top of Ta or the like.

An antiferromagnetic layer 107 containing IrMn, PtMn, FeMn, NiMn, RuRhMn or CrPtMn or the like, for example, is deposited in a thickness on the order of 3 to 20 nm on top of the lower electrode layer 108. A reference layer 106, a non-magnetic intermediate layer 105, and a reference layer 104 are deposited on top of the antiferromagnetic layer 107. The reference layer 106 contains a magnetic film of CoFe or the like, for example, and has a thickness on the order of 1 to 5 nm. The non-magnetic intermediate layer 105 contains at least one element selected from ruthenium (Ru), chromium (Cr), rhodium (Rh), iridium (Ir), and rhenium (Re), or an alloy of two or more of these metals, and has a thickness on the order of 0.85 nm. The reference layer 104 contains a magnetic film of CoFe or CoFeB or the like, for example, and has a thickness on the order of 1 to 5 nm. The antiferromagnetic layer 107, the pinned magnetic layer 106, the non-magnetic intermediate layer 105, and the pinned magnetic layer 104 form a reference layer of a synthetic type. This reference layer may be configured to have a double-layer structure of the antiferromagnetic layer and the reference layer 106. The reference layer is a layer in which a direction of magnetization is pinned.

A barrier layer 103 is formed on top of the reference layer 104. Preferably, the barrier layer 103 is made of MgO in order to obtain a high MR ratio. Besides MgO, an oxide containing at least one or two or more of magnesium (Mg), aluminum (Al), titanium (Ti), zinc (Zn), hafnium (Hf), germanium (Ge), and silicon (Si) may be used. Any of a method using RF sputtering or the like to directly form the oxide, and a method which involves depositing metal and then oxidizing the metal may be used. Oxidation is performed by seal-oxidation, while keeping a chamber sealed, flow-oxidation while evacuating the chamber, radical-oxidation or plasma-oxidation utilizing active oxygen, or the like. A free layer 102 having a structure formed of one layer or two or more layers of a material containing CoFeB or an alloy of at least one or two or more of Co, Fe, Ni or the like is deposited in a thickness on the order of 1 to 10 nm on top of the barrier layer 103. The free layer is a layer in which magnetization is not pinned, and changes resistance according to a relative angle with respect to magnetization of the reference layer. A multilayer structure such for example as Ta (8 nm)/Ru (5 nm)/Cu (30 nm)/Ru (7 nm) is deposited as an upper electrode layer 101 on top of the free layer 102. This layer has the function of protecting the element, and a Ta portion may be replaced by a material such for example as ruthenium (Ru), titanium (Ti), or platinum (Pt). Such a TMR element is fabricated in vacuum by a substrate processing device of a cluster type.

In FIG. 1, the antiferromagnetic layer 107 is made of PtMn of 15 nm thick; the reference layer 106, $Co_{70}Fe_{30}$ of 2.5 nm thick; the non-magnetic intermediate layer 105, Ru of 0.85 nm thick; the reference layer 104, $Co_{60}Fe_{20}B_{20}$ of 3 nm thick; the barrier layer 103, MgO of 1.0 nm thick; and the free layer 102, $Co_{60}Fe_{20}B_{20}$ of 3 nm thick.

Figure 2:
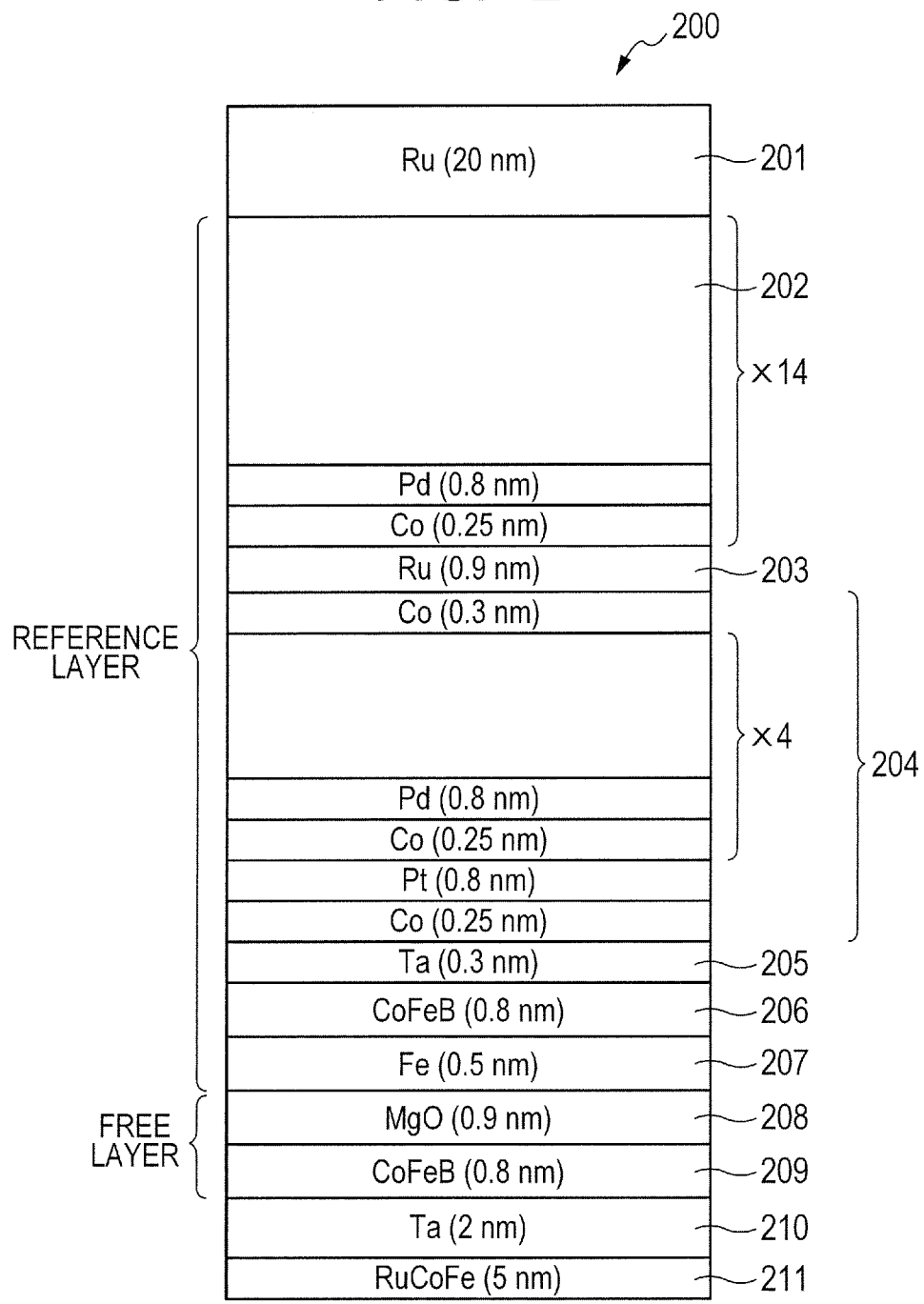
FIG. 2 is a schematic diagram of a multilayer structure of a perpendicular magnetization type element as one example of an element which is applied to an oxidation process according to one embodiment of the present invention.

FIG. 2 is a schematic diagram of a multilayer structure of a perpendicular magnetization type element (hereinafter called a p-MTJ element) disclosed in Non Patent Document 2. In a p-MTJ element 200, buffer layers 211, 210 are first stacked on top of a process substrate. For example, a material containing at least one element of nickel (Ni), iron (Fe), chromium (Cr), and ruthenium (Ru) is used for the buffer layer 211. Also, metal such as tantalum (Ta), hafnium (Hf), niobium (Nb), zirconium (Zr), titanium (Ti), molybdenum (Mo), or tungsten (W) may be used for the buffer layer 210, and besides these, an oxide containing at least one or two or more of magnesium (Mg), aluminum (Al), tantalum (Ta), titanium (Ti), zinc (Zn), hafnium (Hf), germanium (Ge), and silicon (Si) may be used.

CoFeB, for example, is deposited as a free layer 209 on top of the buffer layer 210. Further, an alloy of at least one or two or more of Co and Fe may be disposed between CoFeB and MgO. A total film thickness of a CoFeB or CoFeB/CoFe magnetic layer is of the order of 0.8 to 2.0 nm. A barrier layer 208 is formed on top of the free layer 209. Preferably, the barrier layer is made of MgO in order to obtain a high MR ratio. Besides MgO, an oxide containing at least one or two or more of magnesium (Mg), aluminum (Al), titanium (Ti), zinc (Zn), hafnium (Hf), germanium (Ge), and silicon (Si) may be used. Any of a method using RF sputtering or the like to directly form the oxide, and a method which involves depositing metal and then oxidizing the metal may be used. Oxidation is performed by seal-oxidation while keeping a chamber sealed, flow-oxidation while evacuating the chamber, radical-oxidation or plasma-oxidation utilizing active oxygen, or the like.

A reference layer 207 containing CoFe or the like and having a thickness on the order of 0.2 to 1 nm, a reference layer 206 containing CoFeB or the like and having a thickness on the order of 0.5 to 2.0 nm, an orientation separation layer 205 containing Ta or the like, and a reference layer 204 for imparting perpendicular magnetic anisotropy to the reference layer 206 and the reference layer 207 are deposited on top of the barrier layer 208. In FIG. 2, the two reference layers are each illustrated by way of example as having a multilayer structure of Co/Pd; however, besides this, any form of a multilayer structure such as Co/Pd, Co/Pt, or Co/Ni, an amorphous material such as TbTeCo or GdFeCo, and a ordered alloy such as FePt, CoPt, MnGa, or MnAl may be used. Also, a form may be used in which the reference layer 207 is omitted so that CoFeB of the reference layer 206 is in direct contact with the barrier layer 208. Further, the orientation separation layer 205 may be made of, besides Ta, an alloy of at least one or two or more of tantalum (Ta), hafnium (Hf), niobium (Nb), zirconium (Zr), titanium (Ti), molybdenum (Mo), tungsten (W), platinum (Pt), and ruthenium (Ru), or an oxide containing at least one or two or more of magnesium (Mg), aluminum (Al), tantalum (Ta), titanium (Ti), zinc (Zn), hafnium (Hf), germanium (Ge), and silicon (Si).

A non-magnetic intermediate layer 203 containing an alloy of at least one or two or more of ruthenium (Ru), chromium (Cr), rhodium (Rh), iridium (Ir), and rhenium (Re), and having a thickness on the order of 0.8 nm is formed on top of the reference layer 204. A reference layer 202 constructed of a multilayer structure such as Co/Pd, Co/Pt, or Co/Ni, an amorphous material such as TbTeCo or GdFeCo, and an ordered alloy such as FePt, CoPt, MnGa, or MnAl is formed on top of the non-magnetic intermediate layer 203. The reference layer 207, the reference layer 206, the orientation separation layer 205, a multilayer structure portion of the reference layer 204, the non-magnetic intermediate layer 203, and the reference layer 202 form a reference layer of a synthetic type. This reference layer may have a structure in which the non-magnetic intermediate layer 203 and the reference layer 202 are omitted and the reference layer 207, the reference layer 206, the orientation separation layer 205, and the reference layer 204 form the reference layer. Ta (5 nm) is formed as a cap layer 201 on top of the reference layer 202. Ta may be replaced by a material such for example as ruthenium (Ru), titanium (Ti), or platinum (Pt). Such a TMR element is fabricated in vacuum by a substrate processing device of a cluster type.

In FIG. 2, the buffer layer 211 is made of RuCofe of 5 nm thick; the buffer layer 210, Ta of 2 nm thick; the free layer 209, CoFeB of 0.8 nm thick; the barrier layer 208, MgO of 0.9 nm thick; the reference layer 207, Fe of 0.5 nm thick; the reference layer 206, CoFeB of 0.8 nm thick; the orientation separation layer 205, Ta of 0.3 nm thick; and the reference layer 204 has a structure including four stacks each having Co of 0.25 nm thick and Pt of 0.8 nm thick. The non-magnetic intermediate layer 203 is made of Ru of 0.9 nm thick, the reference layer 202 has a structure including fourteen stacks each having Co of 0.25 nm thick and Pt of 0.8 nm thick, and the cap layer 201 is made of Ru of 20 nm thick.

Figure 3:
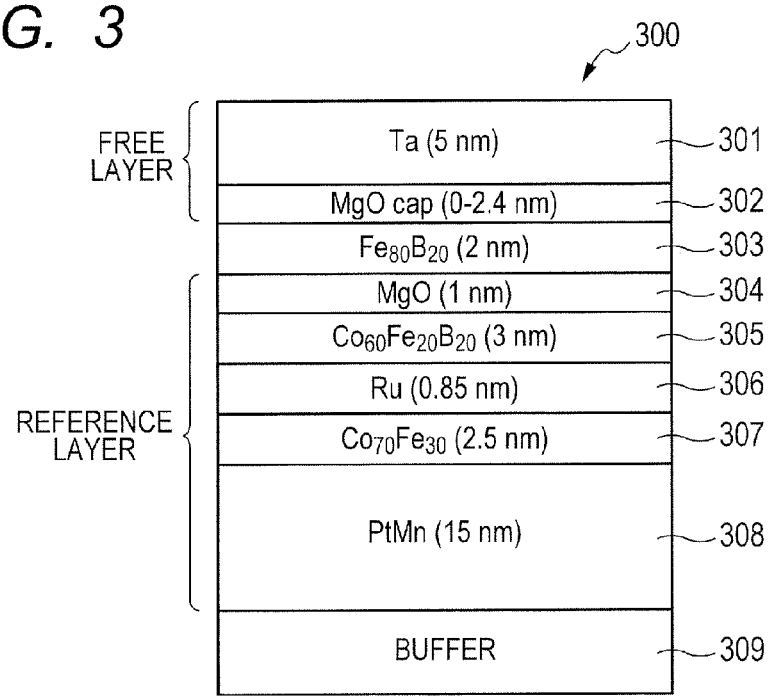
FIG. 3 is a schematic diagram of a multilayer structure of an in-plane magnetization type element as one example of an element which is applied to an oxidation process according to one embodiment of the present invention.

FIG. 3 is a schematic diagram of a multilayer structure of an in-plane magnetization type element (hereinafter called an MTJ element) disclosed in Non Patent Document 3. In an MTJ element 300, Ta (5 nm), for example, is first deposited as a buffer layer 309 on top of a process substrate. Upper Ta also serves as an underlayer film, and, besides Ta, metal such as hafnium (Hf), niobium (Nb), zirconium (Zr), titanium (Ti), molybdenum (Mo), or tungsten (W) may be used. Further, a layer containing at least one element of nickel (Ni), iron (Fe), chromium (Cr), and ruthenium (Ru) and the like, for example, may be deposited on top of Ta or the like. An antiferromagnetic layer 308 containing IrMn, PtMn, FeMn, NiMn, RuRhMn or CrPtMn or the like, for example, is deposited in a thickness on the order of 3 to 20 nm on top of the buffer layer 309. A reference layer 307, a non-magnetic intermediate layer 306, and a reference layer 305 are deposited on top of the antiferromagnetic layer 308. The reference layer 307 contains CoFe or the like, for example, and has a thickness on the order of 1 to 5 nm. The non-magnetic intermediate layer 306 contains an alloy of at least one or two or more of ruthenium (Ru), chromium (Cr), rhodium (Rh), iridium (Ir), and rhenium (Re), and has a thickness on the order of 0.8 nm. The reference layer 305 contains CoFe or CoFeB or the like, for example, and has a thickness on the order of 1 to 5 nm. The antiferromagnetic layer 308, the pinned magnetic layer 307, the non-magnetic intermediate layer 306, and the pinned magnetic layer 305 form a reference layer of a synthetic type. This reference layer may be configured to have a double-layer structure of the antiferromagnetic layer and the two reference layers. The reference layer is a layer in which a direction of magnetization is pinned.

A barrier layer 304 is formed on top of the reference layer 305. Preferably, the barrier layer 304 is made of MgO in order to obtain a high MR ratio. Besides MgO, an oxide containing at least one or two or more of magnesium (Mg), aluminum (Al), titanium (Ti), zinc (Zn), hafnium (Hf), germanium (Ge), and silicon (Si) may be used. Any of a method using RF sputtering or the like to directly form the oxide, and a method which involves depositing metal and then oxidizing the metal may be used. Oxidation is performed by seal-oxidation while keeping a chamber sealed, flow-oxidation while evacuating the chamber, radical-oxidation or plasma-oxidation utilizing active oxygen, or the like. A free layer 303 having a structure formed of one layer or two or more layers of a material containing CoFeB or an alloy of at least one or two or more of Co, Fe, Ni or the like, for example, is deposited in a thickness on the order of 1 to 10 nm on top of the barrier layer 304. The free layer 303 is a layer in which magnetization is not pinned, and changes resistance according to a relative angle with respect to magnetization of the reference layer.

An oxide cap layer 302 is formed on top of the free layer 303. The oxide cap layer 302 has the effect of reducing a critical current density Jc0 for reversal of magnetization, by allowing spin torque to provide easier reversal of magnetization by imparting perpendicular magnetic anisotropy to magnetization of the free layer. An oxide containing at least one or two or more of magnesium (Mg), aluminum (Al), titanium (Ti), zinc (Zn), hafnium (Hf), germanium (Ge), and silicon (Si), or the like can be applied to the oxide cap layer. Oxidation is performed by seal-oxidation while keeping a chamber sealed, flow-oxidation while evacuating the chamber, radical-oxidation or plasma-oxidation utilizing active oxygen, or the like. Ta (5 nm) is formed as a cap layer 301 on top of the oxide cap layer 302. Ta may be replaced by a material such for example as ruthenium (Ru), titanium (Ti), or platinum (Pt). Such a TMR element is fabricated in vacuum by a substrate processing device of a cluster type.

In FIG. 3, the antiferromagnetic layer 308 is made of PtMn of 15 nm thick; the reference layer 307, $Co_{70}Fe_{30}$ of 2.5 nm thick; the non-magnetic intermediate layer 306, Ru of 0.85 nm thick; the reference layer 305, $Co_{60}Fe_{20}B_{20}$ of 3 nm thick; the barrier layer 304, MgO of 1 nm thick; the free layer 303, $Fe_{80}B_{20}$ of 2 nm thick; the oxide cap layer 302, an MgO cap of 0 to 2.4 nm thick; and the cap layer 301, Ta of 5 nm thick.

First Embodiment

Figure 4:
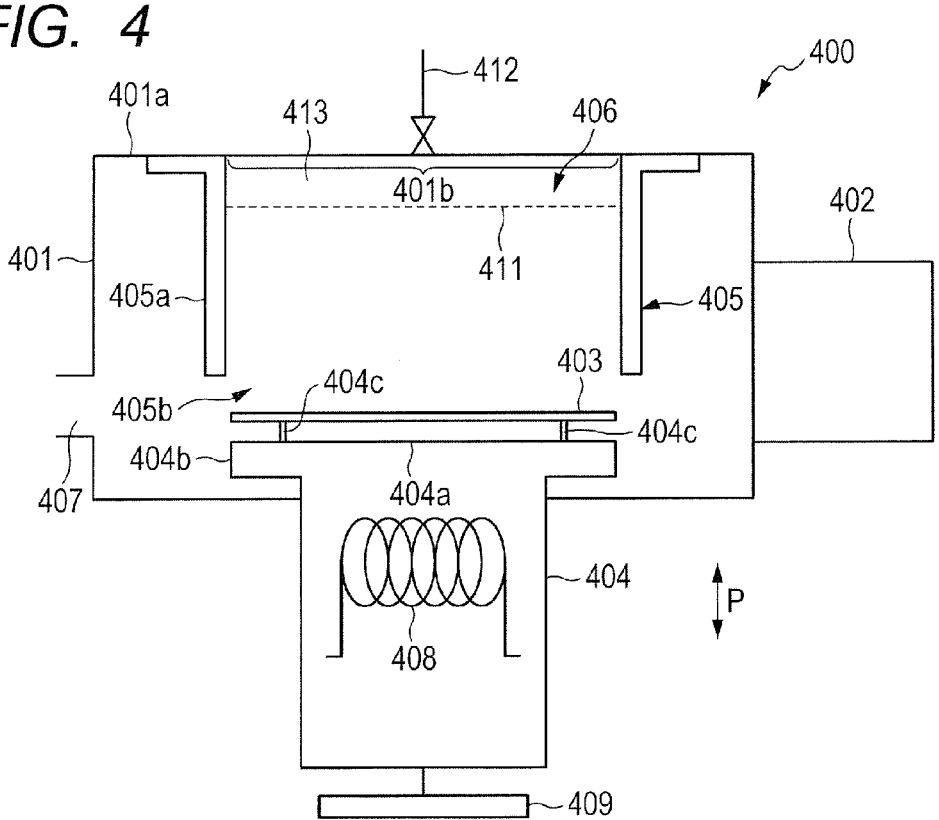
FIG. 4 is a schematic diagram illustrating a general configuration of an oxidation process apparatus according to one embodiment of the present invention, under a substrate transport condition and under an oxidation process condition.
Figure 5:
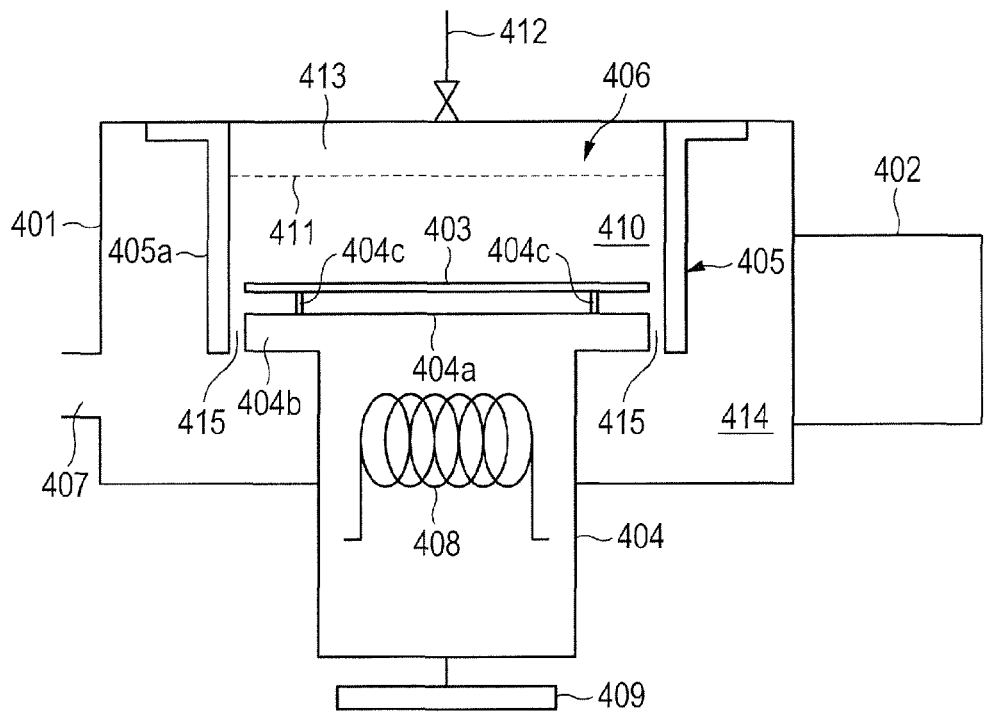
FIG. 5 is a schematic diagram illustrating the general configuration of the oxidation process apparatus according to one embodiment of the present invention, under the oxidation process condition.
Figure 6:
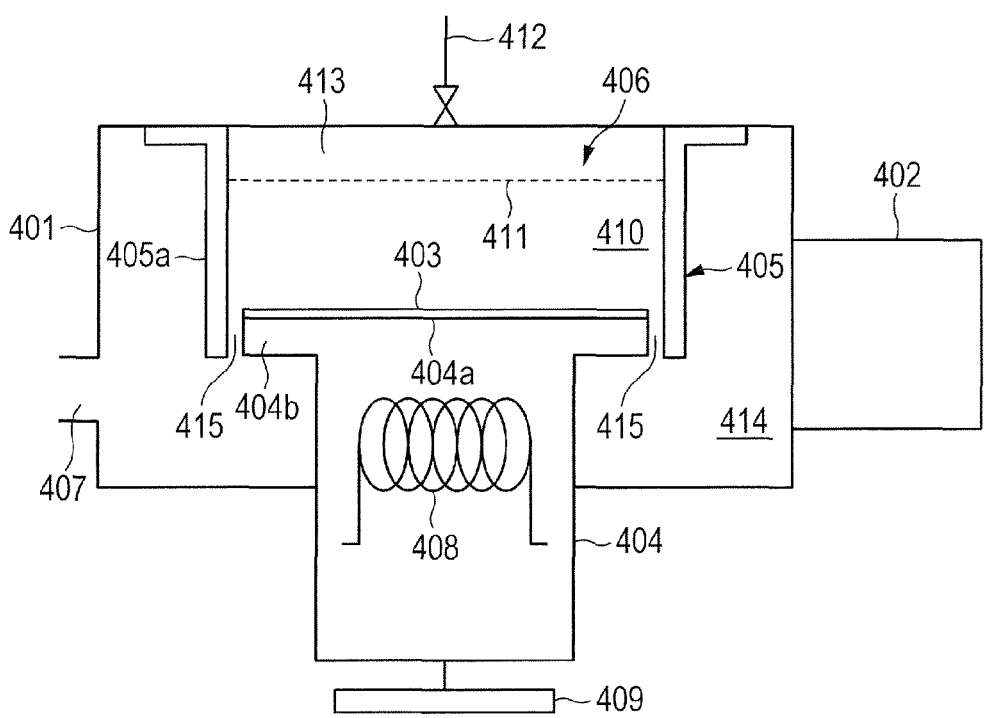
FIG. 6 is a schematic diagram illustrating the general configuration of the oxidation process apparatus according to one embodiment of the present invention, under the substrate transport condition.

FIG. 4 is a schematic diagram illustrating a configuration of an oxidation process apparatus 400 according to the embodiment, under a substrate transport condition and under a first oxidation process (or a first oxidation process condition). FIG. 5 is a schematic diagram illustrating the configuration of the oxidation process apparatus 400 according to the embodiment, and illustrates another example of the first oxidation process. FIG. 6 is a schematic diagram illustrating the configuration of the oxidation process apparatus 400 according to the embodiment, under a second oxidation process (or a second oxidation process condition). In the embodiment, the oxidation process apparatus 400 forms a barrier layer of each element illustrated by way of example in FIGS. 1 to 3. In the embodiment, the barrier layer is made of MgO, and a substrate having Mg formed thereon is subjected to the oxidation process in the oxidation process apparatus 400 thereby to form MgO.

In the embodiment, the "first oxidation process" refers to oxidation for formation of a tunnel barrier layer, which is performed at a temperature (for example, a room temperature) at which Mg does not sublime. Also, the "second oxidation process" refers to oxidation for formation of a tunnel barrier layer, which is performed while the substrate is intentionally heated, or in a state where the substrate is heated at a predetermined temperature. In the embodiment, the second oxidation process is performed after the first oxidation process. Here, in the present invention, the temperature at which sublimation does not take place refers to a temperature at which a metal film is not eliminated in vacuum above saturated vapor pressure.

In FIGS. 4 to 6, the oxidation process apparatus 400 includes a processing container 401, a vacuum pump 402 as an evacuation unit for evacuating the processing container, a substrate holder 404 configured to hold a substrate 403 placed in the processing container 401, a cylindrical member 405 disposed in the processing container 401, a gas introduction unit 406 as an oxygen gas introduction means for introducing an oxygen gas into the processing container 401, and a substrate transport port 407. The substrate transport port 407 is provided with a slit valve.

The substrate holder 404 includes a substrate holding surface 404a configured to hold the substrate 403, a placement portion 404b on which the substrate holding surface 404a is formed, and a protrusion portion (or a supporting portion) 404c protruding from the substrate holding surface 404a toward the gas introduction unit 406, and capable of supporting the substrate 403 apart from the substrate holding surface 404a. The protrusion portion 404c is configured to be capable of executing a protruding condition where the protrusion portion 404c protrudes from the substrate holding surface 404a, and a housed condition where the protrusion portion 404c is housed in the substrate holding surface 404a. Therefore, the substrate 403 is held on the protrusion portion 404c under the protruding condition (see FIGS. 4 and 5), and the substrate 403 is held on the substrate holding surface 404a under the housed condition (see FIG. 6).

A heater 408 as a heating device is provided in the substrate holder 404. Also, a substrate holder drive unit 409 as a position changing means for changing the relative positions of the substrate holder 404 and the cylindrical member 405 is connected to the substrate holder 404.

The substrate holder drive unit 409 moves the substrate holder 404 in directions of arrows P (or a direction in which the substrate holder 404 is moved closer to an oxidation process space 410, and a direction in which the substrate holder 404 is moved away from the oxidation process space 410). Also, the substrate holder drive unit 409 is configured to switch the protrusion portion 404c between the protruding condition and the housed condition. Specifically, under control of the substrate holder drive unit 409, when the protruding condition is established, in a case where the protrusion portion 404c is housed in the substrate holder 404, the protrusion portion 404c is caused to protrude from the substrate holding surface 404a; when the housed condition is established, the protrusion portion 404c protruding from the substrate holding surface 404a is housed in the substrate holder 404. In the embodiment, during substrate transport and during the first oxidation process, under control of the substrate holder drive unit 409, the substrate holder 404 is moved to a position illustrated in FIG. 4, and the protrusion portion 404c is caused to protrude from the substrate holding surface 404a and enter the protruding condition. During carrying-in of the substrate, under this condition, the substrate 403 is transported through the substrate transport port 407 into the processing container 401, and the substrate 403 is mounted on the protrusion portion 404c. During carrying-out of the substrate, the substrate 403 held on the protrusion portion 404c is transported through the substrate transport port 407 out of the processing container 401. Meanwhile, in the first oxidation process, in the state illustrated in FIGS. 4 and 5, the gas introduction unit 406 introduces the oxygen gas into the processing container 401, and thereby, oxidation of Mg takes place prior to oxidation while heating. Also, in the second oxidation process, under control of the substrate holder drive unit 409, the protrusion portion 404c is housed in the substrate holder 404, and thereby, the substrate 403 is placed on the substrate holding surface 404a, and the oxidation process is performed while the substrate 403 is heated (see FIG. 6).

The gas introduction unit 406 is disposed apart from a wall 401a of the processing container 401 facing the substrate holder 404, and includes a shower plate 411 having many holes, an oxygen introduction path 412 disposed in the wall 401a and having a gas introduction port for introducing the oxygen gas into the processing container 401, and a diffusion space 413 forming a space between the shower plate 411 and the wall 401a, and configured to diffuse the oxygen gas introduced through the oxygen introduction path 412. In the embodiment, the oxygen introduction path 412 is disposed so that the oxygen gas is introduced into the diffusion space 413, and the oxygen gas introduced through the oxygen introduction path 412 and diffused in the diffusion space 413 is uniformly supplied through the shower plate 411 into a substrate surface. Plural oxygen introduction paths 412 may be provided.

The cylindrical member 405 is a member having an extending portion 405a extending from the wall 401a toward the side facing the wall 401a (here, the substrate holder side), the extending portion 405a being mounted to the wall 401a in a region 401b including at least a portion of the wall 401a of the processing container 401, to which oxygen introduction path 412 is connected, in such a way as to surround wholly the shower plate 411. In the embodiment, the cylindrical member 405 is a cylindrical member which is circular in a cross section taken perpendicularly to an extending direction; however, the cross section may have other shapes such as a polygonal shape. Also, the cylindrical member 405 is made of aluminum, for example. Preferably, the cylindrical member 405 is made of aluminum because the cylindrical member 405 can be easily worked. Also, besides aluminum, the cylindrical member 405 may be made of titanium or stainless steel (SUS), for example. Also, the cylindrical member 405 may be configured to be attachable to and detachable from the wall 401a. The shower plate 411 is disposed in a space surrounded by the extending portion 405a, or equivalently, a hollow portion of the cylindrical member 405, and a portion of the cylindrical member 405 closer to the wall 401a than the shower plate 411, at least a portion of the wall 401a in the region 401b, and the shower plate 411 form the diffusion space 413.

It is necessary to make more uniform an oxygen pressure on a surface of Mg as an oxidation object, in order to improve an oxygen distribution of MgO and thus improve an in-plane RA distribution of MgO. In other words, in a case where a direction from the gas introduction port to the evacuation side is one direction, pressure in the gas introduction port is high, and pressure on the evacuation side is low. For example, in a case of a highly reactive material such as Mg, it is known that this pressure gradient causes degradation in the oxygen distribution. Therefore, a structure provided with the shower plate 411 is preferable. Specifically, the provision of the shower plate 411 and the cylindrical member 405 enables uniformly supplying the surface of the substrate 403 in a position illustrated in FIGS. 5 and 6 and thus enables reducing unevenness of oxidation distribution of MgO produced by oxidation in the surface of the substrate 403, even if the oxygen introduction path 412 is not coaxial with the vacuum pump 402 as the evacuation unit (for example, in a case where an oxygen introduction direction of the oxygen introduction path 412 is perpendicular to an evacuation direction of the vacuum pump 402, as illustrated in FIGS. 4 and 5). Therefore, the RA distribution can be improved.

The oxygen gas is introduced through the holes of the shower plate 411 into the oxidation process space 410, and thus, the shower plate 411 can be said to be a region (also called an "oxygen gas introduction region") of the gas introduction unit 406, in which a portion for limited introduction of the oxygen gas into the oxidation process space is provided.

In a case where the shower plate 411 is not provided by way of example, the oxygen gas is introduced through the oxygen introduction path 412 into the oxidation process space 410, and thus, the region 401b forms the oxygen gas introduction region.

In the embodiment, the oxygen gas introduction region, the cylindrical member 405, and the substrate holder 404 (or the substrate holding surface 404a) can be said to form the oxidation process space 410.

Also, the cylindrical member 405 is disposed so as to form a gap 415 between the extending portion 405a and at least a portion (or the placement portion 4b) of the substrate holder 404, when the substrate holder 404 is inserted in an opening 405b of the cylindrical member 405, as illustrated in FIGS. 5 and 6. Specifically, the cylindrical member 405 is configured to, during formation in the oxidation process space 410, provide the gap 415 between the extending portion 405a and the placement portion 404b surrounding the substrate holder 404 and having the substrate holding surface 404a formed thereon. Therefore, the oxygen gas introduced from the gas introduction unit 406 into the oxidation process space 410 is evacuated through the gap 415 from the oxidation process space 410 into an external space 414 of the oxidation process space 410. The oxygen gas evacuated from the oxidation process space 410 through the gap 415 into the external space 414 is evacuated from the processing container 401 by the vacuum pump 402.

The substrate holder drive unit 409 moves the substrate holder 404 in the direction of the arrow P so that the substrate holding surface 404a is housed in the cylindrical member 405, and stops movement of the substrate holder 404 at a predetermined position in which the substrate holding surface 404a (or the placement portion 404b) is inserted in the opening 405b. Thus, as illustrated in FIGS. 5 and 6, the oxidation process space 410 which communicates with the external space 414 only through the gap 415 is formed. At this time, the oxidation process space 410 is formed of the shower plate 411, the extending portion 405a, and the substrate holder 404 (or the substrate holding surface 404a). In the embodiment, therefore, in the processing container 401, the shower plate 411 and the extending portion 405a form a surrounding portion which forms, together with the substrate holding surface 404a, a smaller space than a space partitioned by an inner wall of the processing container 401. Therefore, the surrounding portion for the cylindrical member 405 is a surrounding member for partitioning the oxidation process space 410 together with the shower plate 411 and the substrate holder 404 (or the substrate holding surface 404a) so that, during the oxidation process, the oxygen gas introduced by the gas introduction unit 406 is restrictively introduced into the oxidation process space 410 in the processing container 401.

As mentioned above, in a case where the shower plate 411 is not provided by way of example, the oxidation process space 410 is formed of the region 401b, the extending portion 405a, and the substrate holder 404, and thus, in this case, the above-described surrounding portion is the region 401b which is a portion of the inner wall of the processing container 401, and the extending portion 405a.

Also, the substrate holder drive unit 409 may be configured so that the substrate holding surface 404a is rotatable in an in-plane direction of the substrate holding surface 404a. In other words, the substrate holder 404 may be configured so that the substrate holding surface 404a rotates about a direction of a normal to the substrate holding surface 404a. Thus, in a case where the substrate holding surface 404a is rotated, the substrate holder 404 may be provided with an electrostatic chuck (ESC) so that the substrate 403 is electrostatically attracted on the substrate holding surface 404a. Thus, the substrate is attracted on the ESC, and thereby, for example, during the second oxidation process, the oxidation can be performed while the substrate 403 is rotated in a state where the substrate 403 is heated at the predetermined temperature.

Preferably, an oxygen pressure is made uniform on the surface of the substrate 403, in order to improve the oxygen distribution and thus improve the RA distribution. Therefore, even if has introduction from the shower plate 411 is not uniform, the substrate holding surface 404a is rotated thereby to rotate the substrate 403, and thus, a gas concentration distribution of the oxygen gas supplied to the surface of the substrate 403 can be made uniform. Therefore, the RA distribution can be improved.

Also, in the embodiment, the substrate holder drive unit 409 is configured to move the substrate holder 404 along the extending direction of the extending portion 405a in the cylindrical member 405. In other words, the substrate holder drive unit 409 can move the substrate holder 404, in the cylindrical member 405, in a direction in which the substrate holder 404 is moved closer to the shower plate 411 as the oxygen gas introduction region, and in a direction in which the substrate holder 404 is moved away from the shower plate 411.

Figure 7:
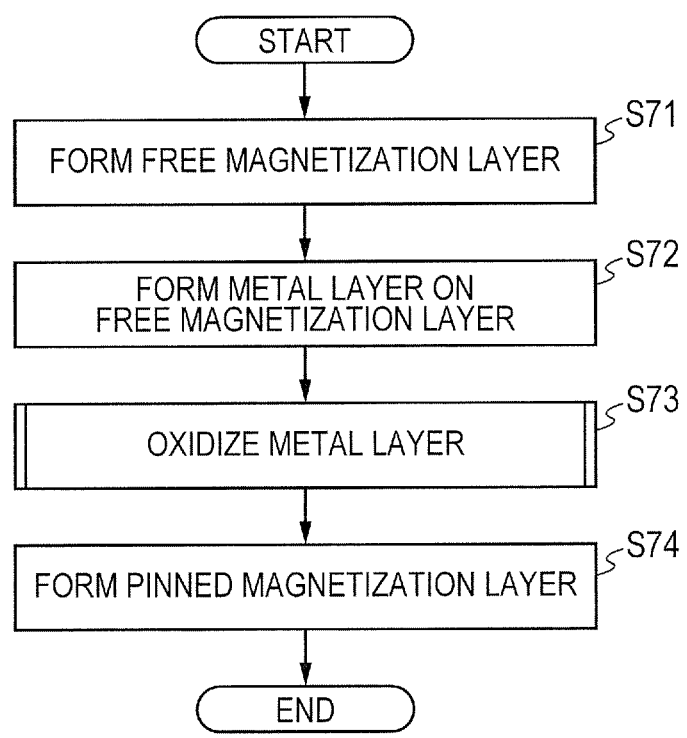
FIG. 7 is a flowchart illustrating a procedure for a method for manufacturing a magnetoresistive element according to one embodiment of the present invention.

FIG. 7 is a flowchart illustrating a procedure for a method for manufacturing a magnetoresistive element according to the embodiment. The magnetoresistive element described here has a structure in which a magnetization free layer, a tunnel barrier layer, and a magnetization pinned layer are stacked one on top of another in sequence on a substrate, by way of example. It is needless to say that the present invention may be applied to manufacture of a magnetoresistive element having a structure in which a magnetization pinned layer, a tunnel barrier layer, and a magnetization free layer are stacked one on top of another in sequence on a substrate.

First, a substrate 403 on which a predetermined layer as an underlayer of the magnetization free layer is formed is prepared. At step S71, in a certain deposition chamber, the magnetization free layer is formed on top of the underlayer. In another example, in a case of the structure in which the magnetization pinned layer, the tunnel barrier layer, and the magnetization free layer are stacked one on top of another in sequence, the magnetization pinned layer is formed on top of the underlayer. In other words, at step S71, one of the magnetization free layer and the magnetization pinned layer is formed on top of the underlayer.

At step S72, in the above-described certain deposition chamber or another chamber, Mg is formed on top of the magnetization free layer deposited at step S71. Thus, this step as a deposition process deposits the above-described metal film for formation of the tunnel barrier layer made of an oxide.

At step S73, the substrate 403 having Mg formed thereon at step S72 is transported through the substrate transport port 407 into the oxidation process apparatus 400, and the oxidation process is performed in the oxidation process apparatus 400. Details of the oxidation process will be described later.

At step S74, the substrate 403 having MgO (or the tunnel barrier layer) formed thereon by the oxidation process at step S73 is transported into in the above-described certain deposition chamber or the other chamber, and the magnetization pinned layer is formed on top of MgO as the tunnel barrier layer. In the above-described other example, in the case of the structure in which the magnetization pinned layer, the tunnel barrier layer, and the magnetization free layer are stacked one on top of another in sequence, the magnetization free layer is formed on top of MgO. In other words, at step S74, the other of the magnetization free layer and the magnetization pinned layer is formed on top of the tunnel barrier layer.

Figure 8:
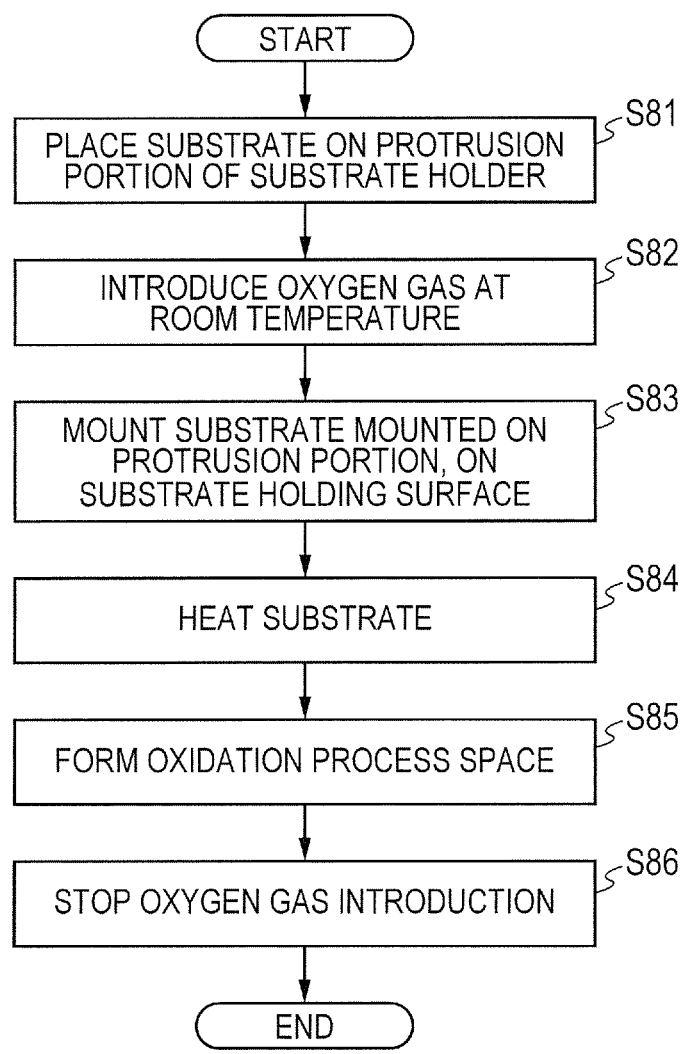
FIG. 8 is a flowchart illustrating a procedure for an oxidation process in a step of forming a tunnel barrier layer according to one embodiment of the present invention.
Figure 9:
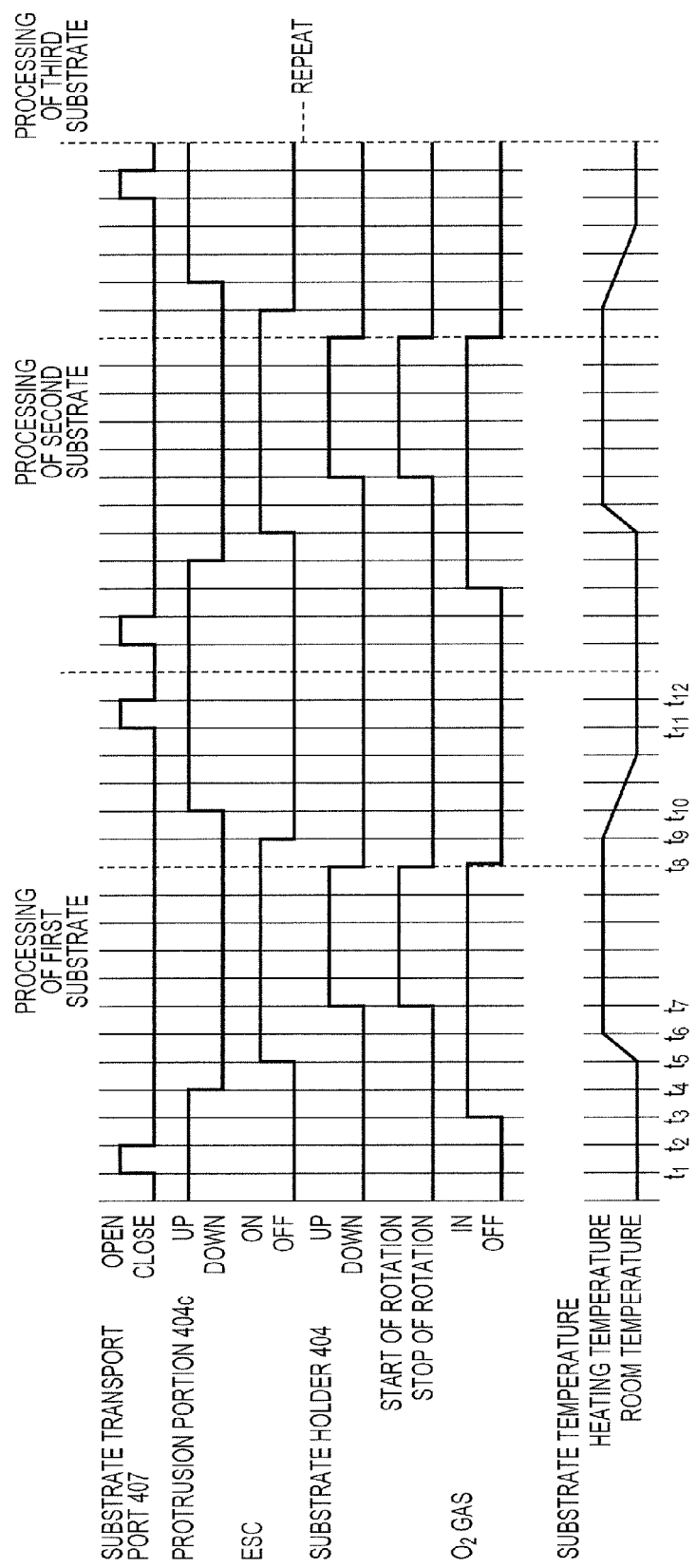
FIG. 9 is a timing chart of the oxidation process according to one embodiment of the present invention.

FIG. 8 is a flowchart illustrating a procedure for an oxidation process in a step of forming the tunnel barrier layer according to the embodiment. FIG. 9 is a timing chart of the oxidation process of FIG. 8. In the embodiment illustrated in FIG. 8, the substrate holder 404 has an ESC function and a substrate rotation mechanism.

At step S81, at time t1, the slit valve of the substrate transport port 407 is opened to transport the substrate 403 having Mg formed thereon into the processing container 401, and the substrate 403 is mounted on the protrusion portion 404c in a protruding state. Thus, the substrate 403 having Mg formed thereon is held on the substrate holder. At time t1, the slit valve is closed.

At step S82, in the state illustrated in FIG. 4, at time t3, the gas introduction unit 406 introduces the oxygen gas into the processing container 401. At this time, the heater 408 is not driven, and a temperature in the processing container 401 is a room temperature. By this oxygen introduction, Mg on the substrate 403 is oxidized (or the first oxidation process is performed). In the embodiment, in the first oxidation process, it is important that sublimation of Mg be minimized. Therefore, a substrate temperature is not limited to the room temperature, and the substrate 403 may be heated by the heater 408 or an external heating device (not illustrated), provided that this temperature is a temperature at which Mg does not sublime. Also, the heater 408 may be always driven to always heat the substrate holder 404 in order to improve throughput. Also in this case, at step S81, the substrate 403 is mounted on the protrusion portion 404c, and thus, the temperature of the substrate 403 is kept at the temperature at which Mg does not sublime.

At step S83, while the oxygen gas introduction started at step S82 is maintained, at time t4, the protrusion portion 404c moves downward and is housed in the substrate holder 404, and thereby, the substrate 403 placed on the protrusion portion 404c is mounted on the substrate holding surface 404a.

At step S84, while the oxygen gas introduction started at step S82 is maintained, at time t5, the heater 408 is driven to start heating the substrate 403 mounted on the substrate holding surface. In other words, the heater 408 heats the substrate holding surface 404a to thus heat the substrate 403. Also, the ESC function of the substrate holder 404 is turned on to electrostatically attract the substrate 403 on the substrate holding surface 404a. The ESC function is turned on, and thereby, the substrate 403 can be heated to a predetermined temperature in a short time, and at time t6, the substrate 403 reaches a target heating temperature. This step starts oxidation (or the second oxidation process) of Mg formed on the substrate 403 and not oxidized by the first oxidation process, while heating Mg. The above-described target heating temperature may be set equal to or higher than a temperature at which Mg sublimes, or may be set lower than this temperature. However, it is preferable that this heating process heat the substrate 403 under a condition where Mg does not sublime.

At step S85, while the oxygen gas introduction started at step S82 is maintained, at time t7, the substrate holder drive unit 409 is driven to move the substrate holder 404 to a position in which the oxidation process space 410 is formed as illustrated in FIG. 6. Thereby, the oxidation process space 410 as a smaller space than the processing container 401 is formed in the processing container 401. At the same time, the substrate holder drive unit 409 is driven to rotate the substrate holding surface 404a about the direction of the normal to the substrate holding surface 404a and thereby rotate the substrate 403. This step may perform the heating of the substrate 403 and the oxygen introduction, while moving the substrate holder 404 closer to the shower plate 411 as the oxygen gas introduction region (or an oxygen gas introduction unit).

In the embodiment, the oxidation process space 410 is formed after step S84; however, the time of formation of the oxidation process space 410 is not so limited. For example, the oxidation process space 410 may be formed at any time (for instance, between step S81 and step S82, etc.) before step S84.

At step S86, at time t8, the gas introduction unit 406 is controlled to stop the oxygen introduction started at step S82. At the same time, the substrate holder drive unit 409 is controlled to stop the substrate holding surface 404a and move the substrate holder 404 to a position illustrated in FIG. 4. Then, at time t9, the driving of the heater 408 is stopped and the ESC function is turned off, and at time t10, the protrusion portion 404c in a housed state is moved upward to protrude from the substrate holding surface 404a, so that the substrate 403 having MgO formed thereon is held on the protrusion portion 404c. Then, at time t11, the slit valve of the substrate transport port 407 is opened to carry the substrate held on the protrusion portion 404c out of the processing container 401, and at time t12, the slit valve is closed. In the embodiment, the vacuum pump 402 connected to the processing container 401 is always driven to always evacuate the processing container 401 in the above-mentioned steps S81 to S86. However, the driving of the vacuum pump 402 is not so limited, and the vacuum pump 402 may be restrictively driven according to each step.

Figure 10:
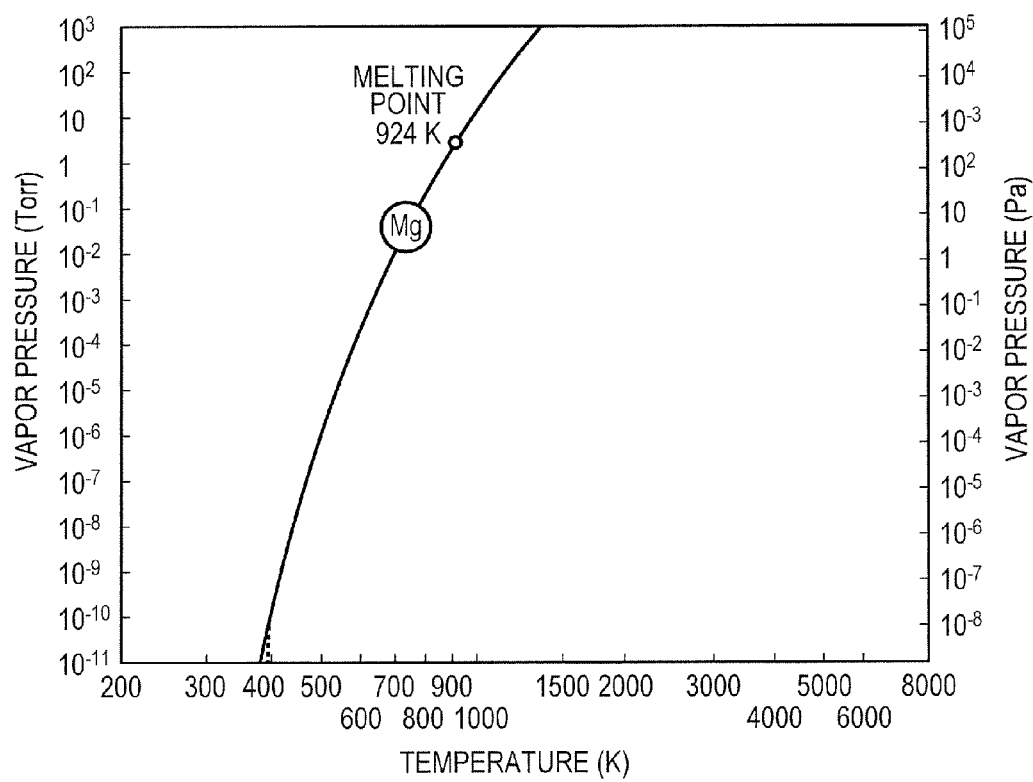
FIG. 10 is a graph illustrating temperature dependence of vapor pressure of Mg, according to one embodiment of the present invention.

According to the embodiment, the oxygen gas is supplied in a state where the protrusion portion 404c holds the substrate 403 as spaced apart from the substrate holding surface 404a, and Mg formed on the substrate 403 is first oxidized at the room temperature as the temperature at which Mg does not sublime. Therefore, the surface (or an exposed surface) of Mg on the substrate 403 and its vicinity can be oxidized at the temperature at which Mg does not sublime. A magnesium (Mg) film is lower in vapor pressure than other metal films, as illustrated in FIG. 10. For example, as can be seen from FIG. 10, Mg starts subliming at about 423 K (about 150° C.) in an atmosphere of $1 \times 10^{-9}$ to $1 \times 10^{-8}$ Torr. Therefore, Mg formed on the substrate 403 sublimes at a temperature of about 150° C. or higher in an atmosphere of $1 \times 10^{-9}$ to $1 \times 10^{-8}$ Torr, and then Mg vaporizes. In the embodiment, the first oxidation process supplies the oxygen gas to subject Mg to the oxidation process at the temperature at which Mg does not sublime, in order to minimize the sublimation of Mg. This enables oxidizing a portion of Mg formed on the substrate 403 to form MgO, while reducing the sublimation of Mg to a minimum.

In the embodiment, then, the protrusion portion 404c is housed in the substrate holder 404 to mount, on the substrate holding surface 404a, the substrate 403 held on the protrusion portion 404c and having formed thereon Mg transformed into MgO at the surface thereof and in its vicinity, and the oxidation process (or the second oxidation process) is performed at low pressure, while the substrate 403 mounted on the substrate holding surface 404*a* is heated to the predetermined temperature by the heater 408. Therefore, Mg which has not been oxidized by the first oxidation process is oxidized by strong oxidation power by undergoing the oxidation while being heated as described above. Heretofore, the oxidation which is performed while the heating takes place has had the problem of increasing the amount of sublimation of Mg, particularly in high vacuum. Meanwhile, in the embodiment, at a stage before the oxidation which is performed while the heating takes place, the surface of Mg formed on the substrate 403 and its vicinity are transformed into MgO by the first oxidation process. Therefore, MgO formed by the first oxidation process is not prone to sublimation and thus functions as a cap layer to suppress sublimation of lower-layer Mg (or a region of Mg inward of the surface thereof and its vicinity).

In the embodiment, moreover, at a stage before the heating of the substrate 403, the oxygen gas is introduced to perform the oxidation process (or the first oxidation process), and thus, a portion of Mg is already transformed into MgO at the time of start of the oxidation process (or the second oxidation process) which is performed while the substrate is heated. Therefore, the throughput can be improved than hitherto. Therefore, the time required for the oxidation process is reduced, and thus, mixing of impurities into MgO can be reduced.

In the embodiment, the heating of the substrate holding surface 404*a* for the heating of the substrate 403 is performed after the mounting of the substrate 403 on the substrate holding surface 404*a* (or after step S83); however, the heating of the substrate holding surface 404*a* may be performed before step S83. For example, the heating of the substrate holding surface 404*a* may be performed between step S81 and step S83. Thereby, at a stage in which the substrate 403 is mounted on the substrate holding surface 404*a* for the second oxidation process, the substrate holding surface 404*a* is in a required heated state. Therefore, standby time until the substrate holding surface 404*a* is heated to a desired temperature can be reduced, and thus, the throughput can be further improved.

In the embodiment, the heating of the substrate is performed at step S84 after the oxygen introduction at step S82. However, in the embodiment, it is important that MgO formed while the sublimation of Mg is reduced to a minimum be formed on the surface of Mg and in its vicinity, before the oxidation which is performed while the substrate is heated. Therefore, if this can be achieved, the oxygen gas introduction and the heating of the substrate may be simultaneously performed. For example, the following may be performed: without the provision of the protrusion portion 404*c*, the substrate 403 is mounted on the substrate holding surface 404*a*, and the oxygen introduction by the gas introduction unit 406 and the heating of the substrate by the heater 408 is simultaneously performed. In this case, for example, even if the substrate is heated to a temperature equal to or higher than the temperature at which Mg sublimes, the substrate temperature remains at the temperature at which Mg does not sublime, during a predetermined period of time after the heating of the substrate, and thus, the oxidation during this period of time can be said to be the oxidation (or the first oxidation process) with the sublimation of Mg minimized. Then, the process continuously changes from the first oxidation process to the second oxidation process, as the substrate temperature increases.

In the embodiment, as mentioned above, the second oxidation process is an oxidation process for uniform oxidation in the surface of Mg, and is an oxidation process which is performed while the substrate temperature is increased to the predetermined temperature or higher. The first oxidation process is an oxidation process for forming MgO for functioning as the cap layer for the sublimation of Mg by the oxidation by the second oxidation process, while reducing the sublimation of Mg, and is an oxidation process which is performed, prior to the second oxidation process, by supplying oxygen to the substrate 403 at the substrate temperature (for example, the room temperature) at which Mg does not sublime. The first oxidation process and the second oxidation process as described above are performed in this order, and thereby, even if the oxidation process is performed in a low-pressure atmosphere while the substrate is heated, the sublimation of Mg can be reduced, and the RA distribution can be improved.

Second Embodiment

Figure 11:
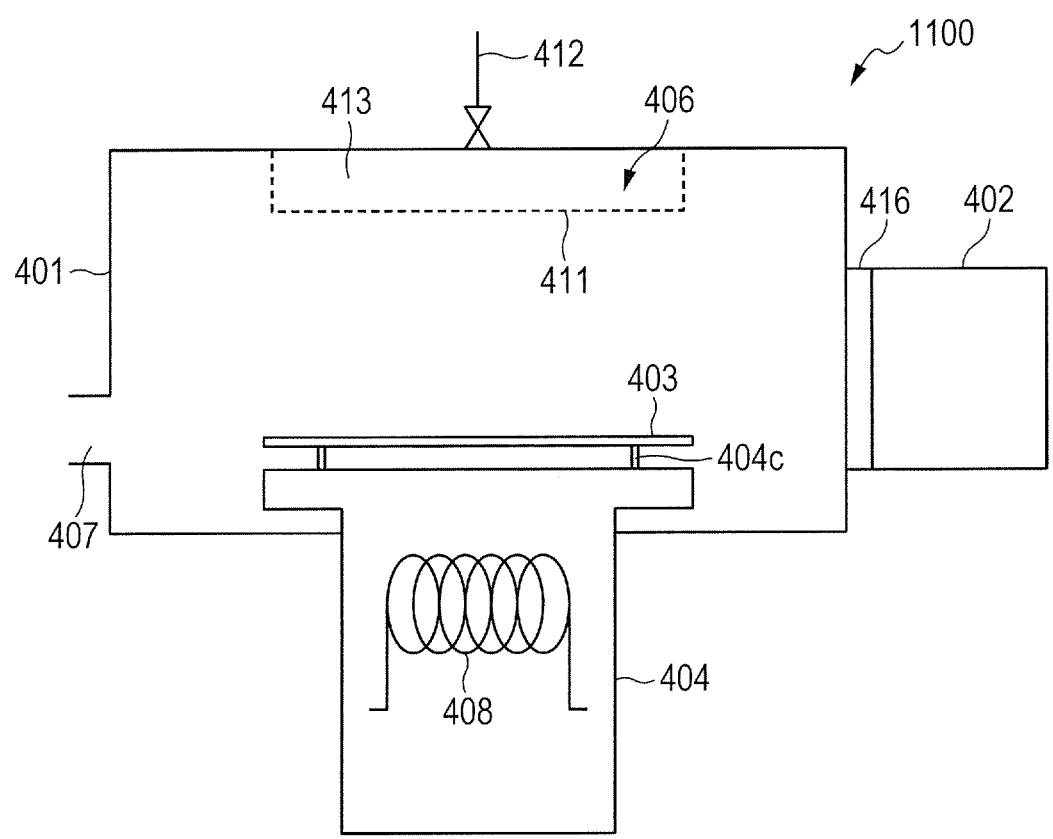
FIG. 11 is a schematic diagram illustrating a general configuration of an oxidation process apparatus according to one embodiment of the present invention, under an oxidation process condition.

In the first embodiment, the oxidation process space 410 smaller than the processing container 401 is formed in the processing container 401; however, the oxidation process space 410 may not be formed. FIG. 11 is a schematic diagram illustrating a general configuration of an oxidation process apparatus according to a second embodiment. An oxidation process apparatus 1100 has the same structure as that of the oxidation process apparatus 400 illustrated in FIGS. 4 to 6, except that the oxidation process apparatus 1100 does not include the cylindrical member 405.

Figure 12:
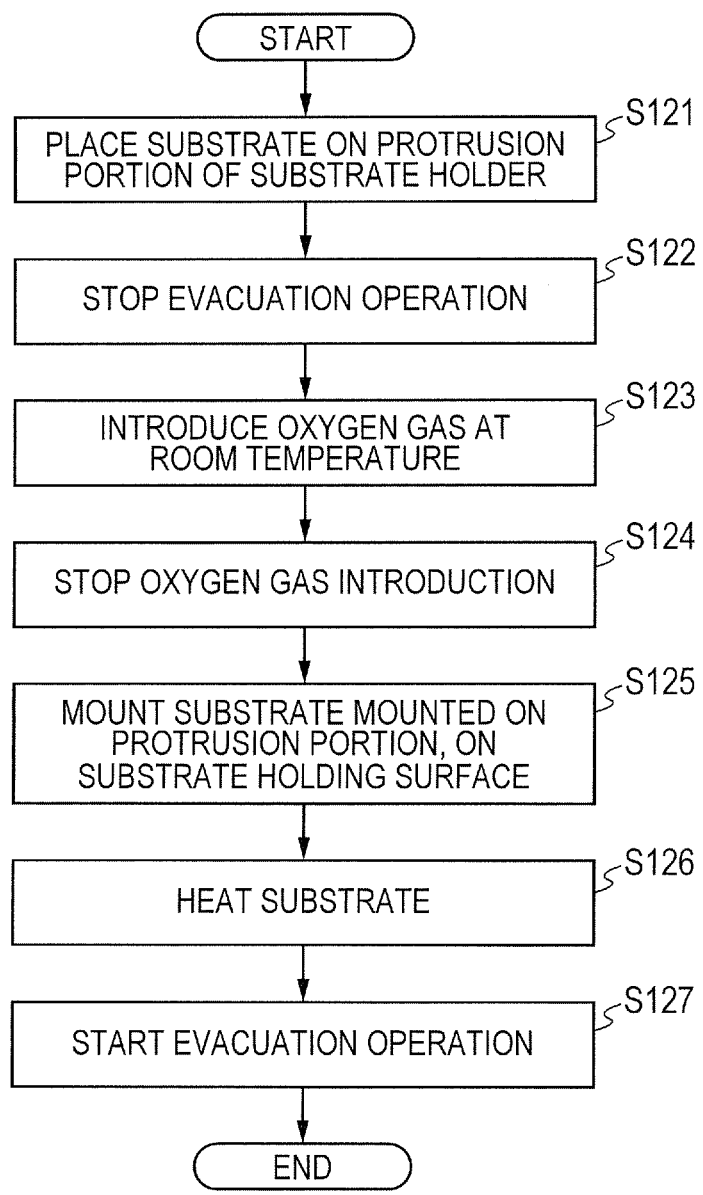
FIG. 12 is a flowchart illustrating a procedure for an oxidation process in a step of forming a tunnel barrier layer according to one embodiment of the present invention.

FIG. 12 is a flowchart illustrating a procedure for an oxidation process in a step of forming a tunnel barrier layer according to the second embodiment.

At step S121, the slit valve of the substrate transport port 407 is opened to transport the substrate 403 having Mg formed thereon into the processing container 401, and the substrate 403 is mounted on the protrusion portion 404*c* in a protruding state. After completion of the mounting of the substrate, the slit valve is closed.

At step S122, a gate valve 416 which has been open is closed to stop evacuation operation. This step is unnecessary if the vacuum pump 402 is not driven at step S121. At step S123, the gas introduction unit 406 introduces the oxygen gas into the processing container 401. At this time, the heater 408 is not driven, and the temperature in the processing container 401 is the room temperature. By this oxygen introduction, Mg on the substrate 403 is oxidized (or the first oxidation process is performed).

At step S124, the oxygen introduction started at step S123 is stopped. Even when the oxygen gas introduction is stopped by this step, the processing container 401 is filled with a predetermined amount of oxygen gas, and thus an oxygen atmosphere is formed in the processing container 401.

At step S125, in a state where the oxygen gas introduction is stopped, the protrusion portion 404*c* moves downward and is housed in the substrate holder 404, and thereby, the substrate 403 placed on the protrusion portion 404*c* is mounted on the substrate holding surface 404*a*.

At step S126, in the state where the oxygen gas introduction is stopped, the heater 408 is driven to start heating the substrate 403 mounted on the substrate holding surface 404*a*. In other words, the heater 408 heats the substrate holding surface 404*a* to thus heat the substrate 403. Although the oxygen gas introduction is stopped at step S124, the oxygen atmosphere is formed around the substrate 403, and thus, the heating at this heating step starts the heating and oxidation (or the second oxidation process) of Mg formed on the substrate 403, which has not been oxidized by the first oxidation process. Then, at step S127, the gate valve 416 closed at step S122 is opened to start the evacuation operation. If the vacuum pump 402 is not driven at step S121, the driving of the vacuum pump 402 is restarted at step S1272 to evacuate the processing container 401.

In the second embodiment, between step S125 and step S126, the gas introduction unit 406 may perform an oxygen gas resupply step of resupplying the oxygen gas into the processing container 401. In this case, a step of stopping the supply of the oxygen gas may be performed after step S126. Also, at step S126, the substrate 403 is heated while the oxygen gas introduced at the oxygen gas resupply step is supplied.

The invention claimed is:

1. A method for manufacturing a magnetoresistive element comprising the steps of:
   forming one of a magnetization free layer and a magnetization pinned layer;
   forming a tunnel barrier layer on top of the formed one of the magnetization free layer and the magnetization pinned layer; and
   forming the other of the magnetization free layer and the magnetization pinned layer on top of the tunnel barrier layer,
   wherein forming the tunnel barrier layer comprises the sub-steps of:
      depositing a metal film on top of a substrate, and
      subjecting the metal film to an oxidation process,
   wherein the oxidation step comprises the sub-steps of, in this order:
      holding the substrate having the metal film formed thereon, on a supporting portion protruding from a substrate holding surface of a substrate holder in a processing container in which the oxidation process is performed,
      supplying an oxygen gas to the substrate by introducing the oxygen gas into the processing container, in a state where the substrate is mounted on the supporting portion,
      stopping the introduction of the oxygen gas,
      mounting the substrate on the substrate holding surface,
      reintroducing the oxygen gas into the processing container by supplying the oxygen gas while moving the substrate closer to an oxygen gas introduction unit provided in the processing container and configured to introduce the oxygen gas thereinto,
      stopping the introduction of the oxygen gas, and
      heating the substrate mounted on the substrate holding surface.

2. The method for manufacturing the magnetoresistive element according to claim 1, wherein the supplying oxygen step includes introducing the oxygen gas at a temperature at which the metal film does not sublime.

3. The method for manufacturing the magnetoresistive element according to claim 1, wherein the substrate holding surface is heated before the mounting the substrate step.

4. The method for manufacturing the magnetoresistive element according to claim 1, wherein the oxygen gas reintroduction step includes introducing the oxygen gas, while rotating the substrate in an in-plane direction of the substrate.

5. The method for manufacturing the magnetoresistive element according to claim 1, wherein the metal film is magnesium.

6. A method for manufacturing a magnetoresistive element comprising the steps of:
   forming one of a magnetization free layer and a magnetization pinned layer;
   forming a tunnel barrier layer on top of the formed one of the magnetization free layer and the magnetization pinned layer; and
   forming the other of the magnetization free layer and the magnetization pinned layer on top of the tunnel barrier layer,
   wherein forming the tunnel barrier layer comprises the sub-steps of:
      depositing a metal film on top of a substrate, and
      subjecting the metal film to an oxidation process,
   wherein the oxidation step comprises the sub-steps of:
      holding the substrate having the metal film formed thereon, on a supporting portion protruding from a substrate holding surface of a substrate holder in a processing container in which the oxidation process is performed,
      supplying an oxygen gas to the substrate by introducing the oxygen gas into the processing container, in a state where the substrate is mounted on the supporting portion, at a temperature at which the metal film does not sublime,
      mounting the substrate on the substrate holding surface, after start of the introduction of the oxygen gas, and
      heating the substrate simultaneously with or after the introduction of the oxygen gas,
   wherein the oxidation step further comprises a step of, after the holding step, forming in the processing container a space formed by a substrate holding surface of the substrate holder and a surrounding portion provided in the processing container, by changing a relative position of the substrate holder with respect to the processing container,
   wherein the space is formed such that the substrate holding surface is surrounded by the surrounding portion and a gap is formed between the surrounding portion and the substrate holder, and
   wherein the oxygen gas introduced into the space is evacuated from the space through the gap.

7. The method for manufacturing the magnetoresistive element according to claim 6, wherein the heating step includes heating the substrate mounted on the substrate holding surface.

8. The method for manufacturing the magnetoresistive element according to claim 7, wherein the substrate holding surface is heated before the mounting the substrate step.

9. The method for manufacturing the magnetoresistive element according to claim 8, wherein the introduction of the oxygen gas is stopped before the mounting the substrate step, and
   wherein the method for manufacturing further comprises an oxygen gas reintroduction step of introducing the oxygen gas into the processing container, after the mounting the substrate step.

10. The method for manufacturing the magnetoresistive element according to claim 9, wherein the oxygen gas reintroduction step includes introducing the oxygen gas, while moving the substrate closer to an oxygen gas introduction unit provided in the processing container and configured to introduce the oxygen gas thereinto.

11. The method for manufacturing the magnetoresistive element according to claim 9, wherein the oxygen gas reintroduction step includes supplying the oxygen gas, while rotating the substrate in an in-plane direction of the substrate.

12. The method for manufacturing the magnetoresistive element according to claim 6, wherein the metal film is magnesium.

13. The method for manufacturing the magnetoresistive element according to claim 6, wherein the supporting portion is configured to be switchable between a protruding condition in which the supporting portion protrudes from the substrate holding surface so that the substrate is apart from the substrate holding surface and a housed condition in which the supporting portion is housed in the substrate holding surface,
wherein the holding the substrate step is performed while the supporting portion is in the protruding condition, and
wherein the mounting the substrate step is performed by switching the supporting portion to be in the housed position.

14. A method for manufacturing a magnetoresistive element comprising the steps of:
forming one of a magnetization free layer and a magnetization pinned layer;
forming a tunnel barrier layer on top of the formed one of the magnetization free layer and the magnetization pinned layer; and
forming the other of the magnetization free layer and the magnetization pinned layer on top of the tunnel barrier layer,
wherein forming the tunnel barrier layer comprises the sub-steps of:
depositing a metal film on top of a substrate, and
subjecting the metal film to an oxidation process,
wherein the oxidation step comprises the sub-steps of:
holding the substrate having the metal film formed thereon, on a supporting portion protruding from a substrate holding surface of a substrate holder in a processing container in which the oxidation process is performed,
supplying an oxygen gas to the substrate by introducing the oxygen gas into the processing container, in a state where the substrate is mounted on the supporting portion,
mounting the substrate on the substrate holding surface, after start of introduction of the oxygen gas, and
heating the substrate mounted on the substrate holding surface,
wherein the supporting portion is configured to be switchable between a protruding condition in which the supporting portion protrudes from the substrate holding surface so that the substrate is apart from the substrate holding surface and a housed condition in which the supporting portion is housed in the substrate holding surface,
wherein the holding the substrate step is performed while the supporting portion is in the protruding condition, and
wherein the mounting the substrate step is performed by switching the supporting portion to be in the housed position.

15. The method for manufacturing the magnetoresistive element according to claim 14, wherein the supplying oxygen step includes introducing the oxygen gas at a temperature at which the metal film does not sublime.

16. The method for manufacturing the magnetoresistive element according to claim 14, wherein the substrate holding surface is heated before the mounting the substrate step.

17. The method for manufacturing the magnetoresistive element according to claim 14, further comprising a step of stopping the introduction of the oxygen gas, before the heating step.

18. The method for manufacturing the magnetoresistive element according to claim 17, wherein the stopping step includes stopping the introduction of the oxygen gas before the mounting the substrate step, and
wherein the method for manufacturing further comprises an oxygen gas reintroduction step of introducing the oxygen gas into the processing container, after the mounting the substrate step.

19. The method for manufacturing the magnetoresistive element according to claim 18, wherein the oxygen gas reintroduction step includes supplying the oxygen gas, while moving the substrate closer to an oxygen gas introduction unit provided in the processing container and configured to introduce the oxygen gas thereinto.

20. The method for manufacturing the magnetoresistive element according to claim 18, wherein the oxygen gas reintroduction step includes introducing the oxygen gas, while rotating the substrate in an in-plane direction of the substrate.

21. The method for manufacturing the magnetoresistive element according to claim 14, wherein the metal film is magnesium.

* * * * *